(12) United States Patent
You et al.

(10) Patent No.: US 7,783,464 B2
(45) Date of Patent: Aug. 24, 2010

(54) CARD FOR SIMULATING PERIPHERAL COMPONENT INTERCONNECT LOADS

(75) Inventors: Yong-Xing You, Shenzhen (CN); Ke-You Hu, Shenzhen (CN); Hai-Qing Zhou, Shenzhen (CN); Feng-Long He, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 753 days.

(21) Appl. No.: 11/499,054

(22) Filed: Aug. 4, 2006

(65) Prior Publication Data

US 2007/0032998 A1     Feb. 8, 2007

(30) Foreign Application Priority Data

Aug. 5, 2005     (CN)     ........................ 2005 1 0036435

(51) Int. Cl.
*G06F 17/50* (2006.01)
(52) U.S. Cl. ............................. 703/14; 307/24; 307/28; 307/38; 307/42
(58) Field of Classification Search .................. 703/13, 703/14; 307/40, 18, 24, 28, 38, 42
See application file for complete search history.

(56) References Cited

U.S. PATENT DOCUMENTS

| 4,042,830 A | * | 8/1977 | Kellenbenz et al. | ........... 307/40 |
| 6,611,912 B1 | * | 8/2003 | Maleck et al. | ............. 713/100 |
| 7,103,704 B2 | * | 9/2006 | Chatterjee | ................... 710/315 |

OTHER PUBLICATIONS

Merkle et al., Modelling of Industrial Loads for Voltage Stability Studies in Power Systems, IEEE, Electrical and Computer Engineering, May 2001, pp. 881-886.*

* cited by examiner

*Primary Examiner*—Russell Frejd
(74) *Attorney, Agent, or Firm*—Wei Te Chung

(57) ABSTRACT

A card for simulating peripheral component interconnect (PCI) loads includes an interface configured for electrically connecting to a motherboard and a load circuit configured for simulating the different loads. The load circuit comprises at least one power module receiving a voltage from the interface. The power module is capable of changing resistance of the power module thereby to thermally consume various powers to simulate the different loads. Because the card consumes various power according to testing requirement, the stability of the motherboard can be tested in various load power without connecting actual PCI loads to the motherboard.

12 Claims, 3 Drawing Sheets

CARD FOR SIMULATING PERIPHERAL COMPONENT INTERCONNECT LOADS

BACKGROUND OF THE INVENTION

1. Field of the Invention

The present invention relates to a card for simulating peripheral component interconnect (PCI) loads, and particularly to a card whose power can be adjusted as required.

2. Description of Related Art

In motherboard manufacturing, it is necessary to test motherboard stability, for example, when load power of the motherboard is maximal, it is necessary to test whether the motherboard is stable. The load may be a central processing unit (CPU), a hard disk drive (HDD), an optical disk drive (ODD), a floppy disk drive (FDD), or a certain PCI device, and so on.

There are two typical methods for testing motherboard stability. By one method, actual PCI devices are inserted in the corresponding slots of the motherboard. However, it is costly to use the actual PCI devices for testing. By the other method, a card for simulating a PCI load is inserted into the corresponding slot of the motherboard. However, since power dissipated by the card is fixed the motherboard cannot be tested under different load conditions.

What is needed, therefore, is a card with adjustable loads for simulating different PCI loads.

SUMMARY OF THE INVENTION

A card for simulating different peripheral component interconnect (PCI) loads is disclosed. The card in accordance with a preferred embodiment of the invention includes an interface configured for electrically connecting to a motherboard; and a load circuit for simulating the different loads. The load circuit comprises at least one power module receiving a voltage from the interface; and the power module consumes various powers.

Other advantages and novel features will become more apparent from the following detailed description when taken in conjunction with the accompanying drawings, in which:

DETAILED DESCRIPTION OF THE INVENTION

Figure 1:
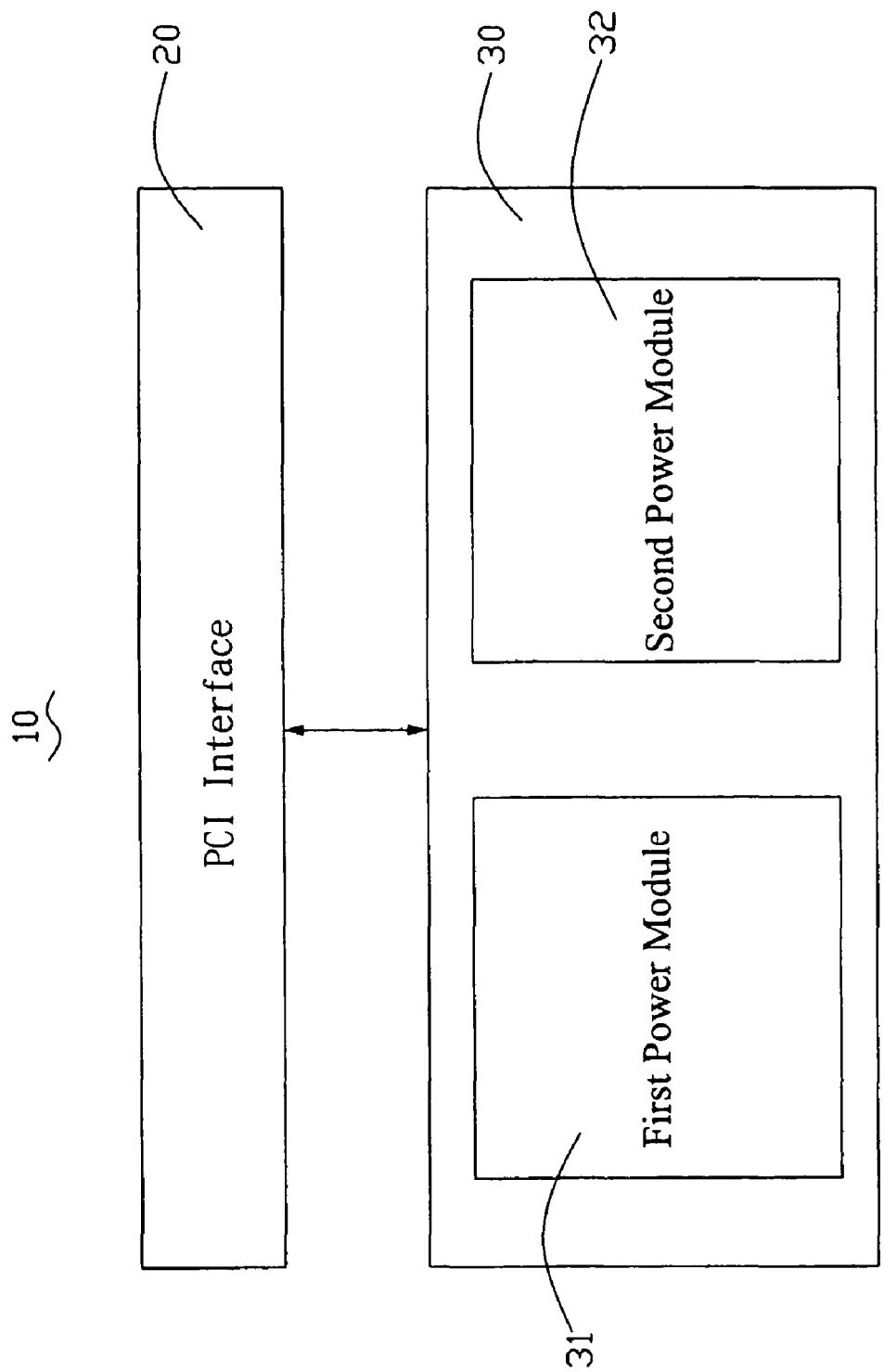
FIG. 1 is a block diagram of a card for simulating a PCI load in accordance with a preferred embodiment of the present invention, the card includes a first module and a second module.

Referring to FIG. 1, a card 10 for simulating PCI loads according with a preferred embodiment of the invention includes a PCI interface 20 for electrically connecting the card 10 to a motherboard, and a load circuit 30 for simulating various PCI loads. The load circuit 30 includes a first power module 31 configured for receiving a 5V voltage U1 (see FIG. 2) from a pin of the PCI interface, and a second power module 32 receiving a 3.3V voltage U2 (see FIG. 2) from another pin of the PCI interface.

Figure 2:
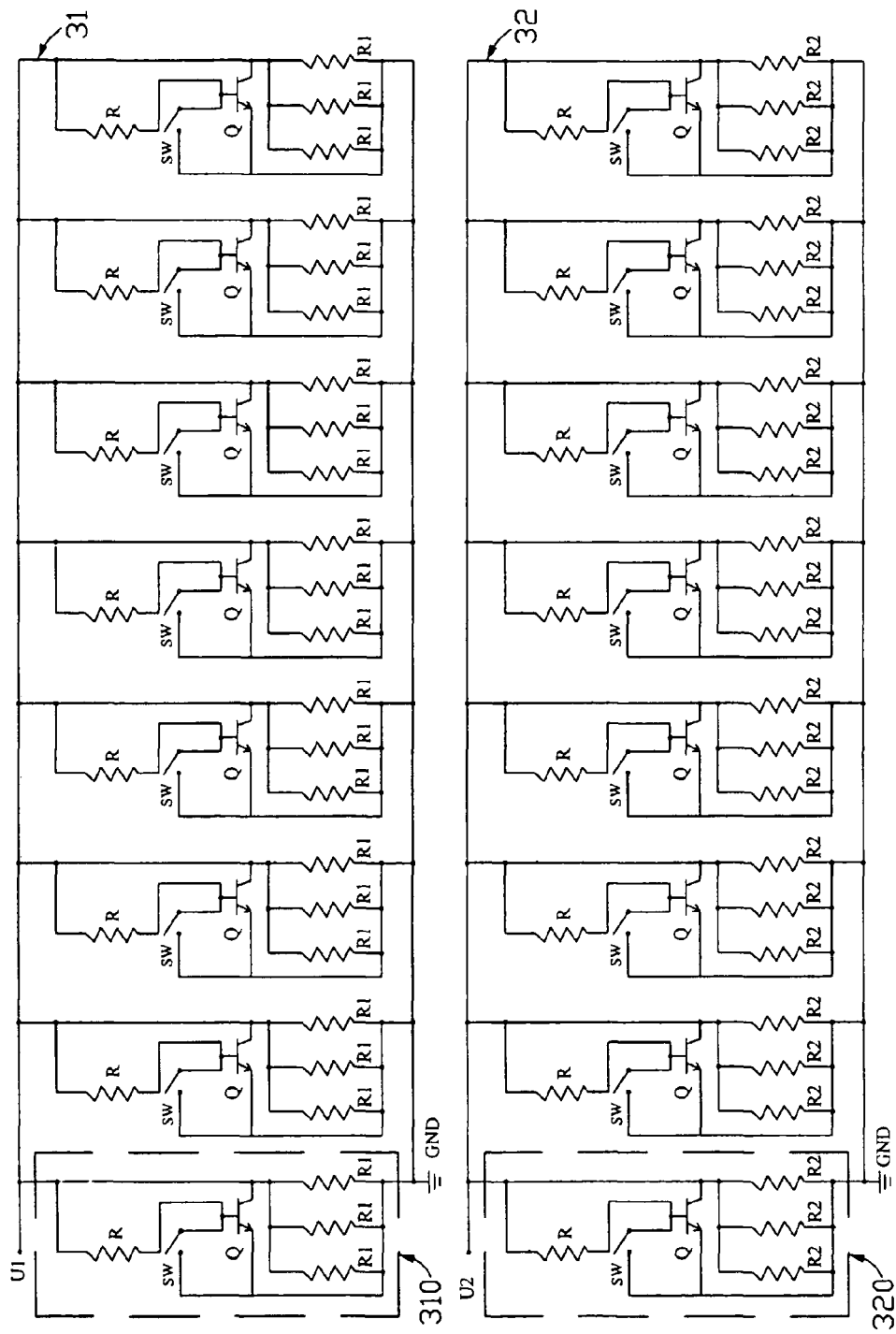
FIG. 2 is a circuit diagram of the first module and the second module of FIG. 1.

Referring to FIG. 2, the first power module 31 includes a plurality of load units 310 which are connected in parallel. The second power module 32 includes a plurality of load units 320 which are also connected in parallel. In the embodiment, eight load units 310 and eight load units 320 are employed as an example.

Figure 3:
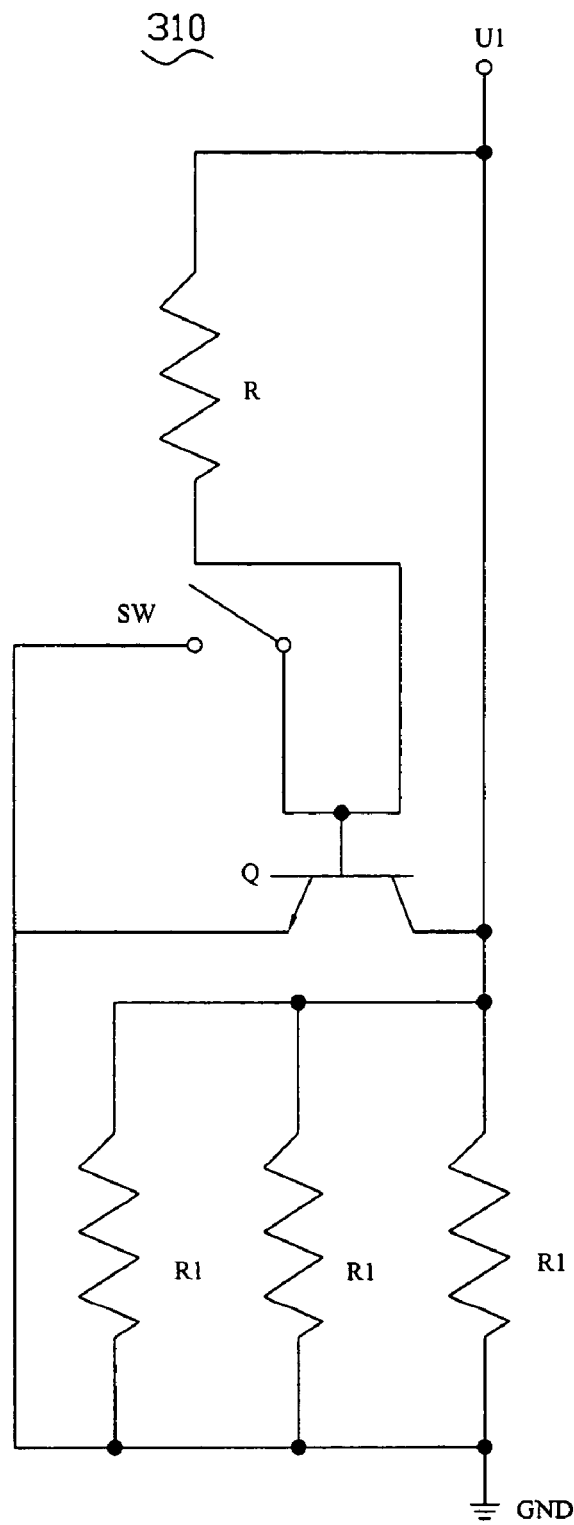
FIG. 3 is circuit diagram of a first load unit of the first module of FIG. 2.

Referring to FIG. 3, each of the load units 310 includes a switch SW, a transistor Q acting as an electrical switch, a limiting resistor R for limiting a current of a base of the transistor Q, and a plurality of load resistors R1. The base of the transistor Q receives the 5V voltage through the limiting resistor R. The transistor Q and the load resistors R1 are connected in parallel between a power supply providing the 5V voltage and ground. The switch SW is connected between the base of the transistor Q and an emitter of the transistor Q. A resistance of the limiting resistor R is much more than a resistance of the load resistors R1. In this embodiment, the resistance of the limiting resistor R is 4.7 kΩ, and the resistance of the load resistor R1 is 39Ω. Configuration of the load units 310 and that of the units 320 are same, except that resistance of load resistors R2 are 20Ω and the load units 320 receive the 3.3V voltage.

When the switch SW is turned on, the transistor Q is turned off. Thus, current is drawn from the motherboard to pass through the load resistors R1 thermally consuming power thus simulating a desired PCI load. Thus, one of the load units 310 is in operation. When the switch SW is turned off, the transistor Q is turned on shorting current past the load resistors R1. Current drawn by the transistor Q is small and can be ignored. Thus, there is virtually no load at the one of the load units 310.

When the load units 310 are operating, power consumed by each of the load units 310 can be calculated as: $3[(5V)2/39\Omega]=1.923$ W. In the same way, when the load units 320 are operating, power consumed by each of the load units 320 can be calculated as: $3[(3.3V)2/20\Omega]=1.634$ W. Thus, by combining different amounts of the load units 310 and the load units 320 during operation, different amounts of power are consumed simulating a variety of PCI loads. Relationship between power consumed (or amount of load) by the load card 10 and various combinations of the load units 310 and the load units 320 are given as follows in table 1:

Table 1 Relationship Between Power Consumed by the Load Card and Various Combinations of Load Units 310 and Load Units 320.

TABLE 1

Relationship Between Power Dissipated by the Load Card and Various Combinations of Load Units 310 and Load Units 320

| Number of Load Units 310 | Number of Load Units 320 | | | | | | | | |
|---|---|---|---|---|---|---|---|---|---|
| | 0 | 1 | 2 | 3 | 4 Power | 5 | 6 | 7 | 8 |
| 0 | 0 | 1.634 | 3.268 | 4.902 | 6.536 | 8.170 | 9.804 | 11.438 | 13.072 |
| 1 | 1.923 | 3.557 | 5.191 | 6.825 | 8.459 | 10.093 | 11.727 | 13.361 | 14.995 |

TABLE 1-continued

Relationship Between Power Dissipated by the Load Card and
Various Combinations of Load Units 310 and Load Units 320

| Number of Load Units 310 | Number of Load Units 320 | | | | | | | | |
|---|---|---|---|---|---|---|---|---|---|
| | 0 | 1 | 2 | 3 | 4 Power | 5 | 6 | 7 | 8 |
| 2 | 3.846 | 5.480 | 7.114 | 8.748 | 10.382 | 12.016 | 13.650 | 15.284 | 16.918 |
| 3 | 5.769 | 7.403 | 9.037 | 10.671 | 12.305 | 13.939 | 15.573 | 17.207 | 18.841 |
| 4 | 7.692 | 9.326 | 10.960 | 12.594 | 14.228 | 15.862 | 17.496 | 19.130 | 20.764 |
| 5 | 9.615 | 11.249 | 12.883 | 14.517 | 16.151 | 17.785 | 19.419 | 21.053 | 22.687 |
| 6 | 11.538 | 13.172 | 14.806 | 16.440 | 18.074 | 19.708 | 21.342 | 22.976 | 24.610 |
| 7 | 13.461 | 15.095 | 16.729 | 18.363 | 19.997 | 21.631 | 23.265 | 24.899 | 26.533 |
| 8 | 15.384 | 17.018 | 18.652 | 20.286 | 21.920 | 23.554 | 25.188 | 26.822 | 28.456 |

When testing a motherboard, the interface 20 of the load card 10 is inserted in a corresponding slot of the motherboard. Then according to test requirements, some of the switches SW are turned on, and the remaining are turned off according to the desired magnitude of the load. The stability of the motherboard is then tested under various load conditions without connecting the actual PCI loads to the motherboard, and without changing cards.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A card for simulating different peripheral component interconnect (PCI) loads, comprising:
    an interface configured for electrically connecting to a motherboard; and
    a load circuit for simulating the different loads, wherein the load circuit comprises at least one power module receiving a voltage from the interface, wherein the power module selectively changes resistance thereof to thermally consume powers of the corresponding voltage thereby simulating the different loads;
    wherein the power module comprises at least two load units, the load units are connected between the interface and a ground in parallel, each of the load units comprising a switch circuit configured for selectively controlling the corresponding load unit to receive the voltage from the interface, so that the controlled load unit thermally consumes power of the voltage to simulate the different loads;
    wherein the switch circuit comprises a limiting resistor, a switch, a transistor acting as an electrical switch, wherein a base of the transistor receives the voltage through the limiting resistor, a collector of the transistor receives the voltage, an emitter of the transistor is grounded, and wherein the switch is connected between the base and the emitter of the transistor.

2. The card as claimed in claim 1, wherein each of the load units further comprises at least one load resistor, wherein the at least one load resistor is connected between the collector of the transistor and the ground.

3. The card as claimed in claim 2 wherein the resistance of the limiting resistor is more than the resistance of the at least one load resistor.

4. A card for simulating different peripheral component interconnect (PCI) loads, comprising:
    an interface configured for electrically connecting to a motherboard; and
    at least two power modules each receiving voltages from the interface, each of the at least two power modules comprising at least one load unit connected between the interface and ground in parallel;
    the at least one load unit comprising a switch circuit configured for selectively controlling the at least one load unit to receive the corresponding voltage from the interface, such that the controlled load unit thermally consumes power of the corresponding voltage to simulate the different loads;
    wherein values of the voltages from the interface are different.

5. The card as claimed in claim 4, wherein the switch circuit comprises a limiting resistor, a switch, a transistor acting as an electrical switch, wherein a base of the transistor receives the voltages through the limiting resistor, a collector of the transistor receives the voltages, an emitter of the transistor is grounded, and wherein the switch is connected between the base and the emitter of the transistor.

6. The card as claimed in claim 5, wherein each of the at least two load units further comprises at least one load resistor, wherein the at least one load resistor is connected between the collector of the resistor and ground.

7. The card as claimed in claim 6, wherein the resistance of the limiting resistor is more than the resistance of the at least one load resistor.

8. A card for simulating different electrical component loads, comprising:
    an interface configured for connecting to a power source; and
    at least two load units connected to the interface in parallel for receiving voltages from the power source via the interface, each of the load units comprising at least one load resistor, wherein a first terminal of the at least one load resistor is connected to the interface via a switch circuit, a second terminal of the at least one load resistor is connected to ground, wherein the switch circuit selectively controls the corresponding load unit to receive the corresponding voltage from the interface, such that the controlled load resistor thermally consumes power of the corresponding voltage to simulate the different load;
    wherein the switch circuit comprises a limiting resistor, a switch, a transistor acting as an electrical switch, a base of the transistor receiving one of the voltages through the limiting resistor, a collector of the transistor receiving said one of the voltages directly, an emitter of the transistor being grounded, the switch being connected between the base and the emitter, and the at least one load resistor being connected between the collector and the emitter.

9. The card as claimed in claim 8, wherein the resistance of the limiting resistor is more than that of the at least one load resistor.

10. The card as claimed in claim 8, wherein the voltages received by the at least two load units are different.

11. The card as claimed in claim 8, wherein the voltages received by the at least two load units are the same.

12. The card as claimed in claim 8, wherein the interface is a peripheral component interconnect card interface, and the power source is provided by a motherboard.

* * * * *